United States Patent
Jo et al.

(10) Patent No.: US 12,520,695 B2
(45) Date of Patent: Jan. 6, 2026

(54) DISPLAY APPARATUS INCLUDING LAYER ENHANCING COLOR PURITY BY PASSING LIGHT OF PREDETERMINED WAVELNGTH RANGE

(71) Applicant: SAMSUNG DISPLAY CO., LTD., Yongin-si (KR)

(72) Inventors: Kangmoon Jo, Yongin-si (KR); Unbyoll Ko, Yongin-si (KR); Sunkwang Kim, Yongin-si (KR); Hyoungsub Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 602 days.

(21) Appl. No.: 17/943,650

(22) Filed: Sep. 13, 2022

(65) Prior Publication Data

US 2023/0255079 A1 Aug. 10, 2023

(30) Foreign Application Priority Data

Feb. 8, 2022 (KR) .......................... 10-2022-0016424

(51) Int. Cl.
*H10K 59/38* (2023.01)
*H10K 50/86* (2023.01)
*H10K 59/122* (2023.01)

(52) U.S. Cl.
CPC ............. *H10K 59/38* (2023.02); *H10K 50/86* (2023.02); *H10K 59/122* (2023.02)

(58) Field of Classification Search
None
See application file for complete search history.

(56) References Cited

U.S. PATENT DOCUMENTS

| 8,634,366 B2 | 1/2014 | Kim et al. |
| 10,600,985 B2 | 3/2020 | Lee et al. |

(Continued)

FOREIGN PATENT DOCUMENTS

| KR | 1020100120863 A | 11/2010 |
| KR | 101633326 B1 | 6/2016 |

(Continued)

*Primary Examiner* — Nduka E Ojeh
(74) *Attorney, Agent, or Firm* — CANTOR COLBURN LLP

(57) ABSTRACT

A display apparatus includes a first sub-pixel, a second sub-pixel, and a third sub-pixel disposed on a substrate and respectively emitting different colors, light-emitting devices disposed on the substrate and respectively overlapping the first sub-pixel through the third sub-pixel, a first thin-film encapsulation layer disposed on light-emitting devices, a second thin-film encapsulation layer disposed on the first thin-film encapsulation layer, a functional layer disposed between the first thin-film encapsulation layer and the second thin-film encapsulation layer, and including a first quantum dot layer corresponding to the first sub-pixel, a second quantum dot layer corresponding to the second sub-pixel, and a transmissive layer corresponding to the third sub-pixel, a low color filer that is a blue color filter disposed between the first thin-film encapsulation layer and the functional layer to cover the first sub-pixel through the third sub-pixel, and an upper color filter disposed on the second thin-film encapsulation layer.

20 Claims, 7 Drawing Sheets

(56) References Cited

U.S. PATENT DOCUMENTS

| | | | | |
|---|---|---|---|---|
| 2016/0104865 | A1* | 4/2016 | Jung | H10K 59/873 |
| | | | | 257/40 |
| 2019/0121176 | A1* | 4/2019 | Lee | H10K 59/879 |
| 2019/0157354 | A1* | 5/2019 | Lee | H10K 59/38 |
| 2020/0091247 | A1* | 3/2020 | Lee | H10K 77/111 |
| 2021/0074770 | A1* | 3/2021 | Choe | G02B 5/206 |
| 2021/0143223 | A1 | 5/2021 | Rho | |
| 2021/0175468 | A1 | 6/2021 | Lee | |
| 2024/0224691 | A1* | 7/2024 | Zhang | H10K 59/877 |

FOREIGN PATENT DOCUMENTS

| | | |
|---|---|---|
| KR | 1020180125673 A | 11/2018 |
| KR | 1020210057647 A | 5/2021 |
| KR | 1020210070461 A | 6/2021 |

* cited by examiner

DISPLAY APPARATUS INCLUDING LAYER ENHANCING COLOR PURITY BY PASSING LIGHT OF PREDETERMINED WAVELNGTH RANGE

This application claims priority to Korean Patent Application No. 10-2022-0016424, filed on Feb. 8, 2022, and all the benefits accruing therefrom under 35 U.S.C. § 119, the content of which in its entirety is herein incorporated by reference.

BACKGROUND

1. Field

Embodiments relate to a display apparatus.

2. Description of the Related Art

Display apparatuses visually display data. With a development of various electronic devices such as a mobile phone, a personal digital assistant ("PDA"), a computer, and a large television ("TV"), various types of display apparatuses applicable to the various electronic devices are being developed. The display apparatuses widely used in the market include a liquid crystal display apparatus including a backlight unit and an organic light-emitting display apparatus for emitting light of a different color for each color gamut, and recently, a display apparatus including a quantum dot color conversion layer ("QD-CCL") is being developed. Quantum dots are excited by incident light to emit light having a wavelength longer than a wavelength of the incident light, and light of a low wavelength band is mainly used as the incident light. As the display apparatuses are being used in various ways, various designs are being attempted to improve the quality of display apparatuses.

SUMMARY

Embodiments include a display apparatus having excellent color purity. However, the embodiments are examples, and do not limit the scope of the invention.

Additional features will be set forth in part in the description which follows and, in part, will be apparent from the description, or may be learned by practice of the presented embodiments.

In an embodiment, a display apparatus including a substrate, a first sub-pixel, a second sub-pixel, and a third sub-pixel which are disposed on the substrate and respectively emit different colors, a plurality of light-emitting devices disposed on the substrate and respectively overlapping the first sub-pixel through the third sub-pixel, a first thin-film encapsulation layer disposed on the plurality of light-emitting devices, a second thin-film encapsulation layer disposed on the first thin-film encapsulation layer, a functional layer disposed between the first thin-film encapsulation layer and the second thin-film encapsulation layer, and including a first quantum dot layer corresponding to the first sub-pixel, a second quantum dot layer corresponding to the second sub-pixel, and a transmissive layer corresponding to the third sub-pixel, a low color filer that is a blue color filter disposed between the first thin-film encapsulation layer and the functional layer to cover all of the first sub-pixel, the second sub-pixel, and the third sub-pixel, and an upper color filter disposed on the second thin-film encapsulation layer.

In an embodiment, the upper color filter may include a first color filter corresponding to the first sub-pixel, a second color filter corresponding to the second sub-pixel, and a third color filter corresponding to the third sub-pixel.

In an embodiment, each of the first thin-film encapsulation layer and the second thin-film encapsulation layer may include a first inorganic encapsulation layer, a second inorganic encapsulation layer on the first inorganic encapsulation layer, and an organic encapsulation layer disposed between the first inorganic encapsulation layer and the second inorganic encapsulation layer.

In an embodiment, each of the plurality of light-emitting devices may include a sub-pixel electrode, a counter electrode on the sub-pixel electrode, and an emission layer disposed between the sub-pixel electrode and the counter electrode.

In an embodiment, all of the plurality of light-emitting devices may emit blue light.

In an embodiment, the first quantum dot layer may convert light of a first wavelength band into light of a second wavelength band, and the second quantum dot layer may convert light having a wavelength in the first wavelength band into light having a wavelength in a third wavelength band.

In an embodiment, at least two selected from among the first color filter, the second color filter, and the third color filter may overlap each other to define a light-blocking portion.

In an embodiment, the first color filter may be a red color filter, the second color filter may be a green color filter, and the third color filter may be a blue color filter.

In an embodiment, the display apparatus may further include an organic layer covering the upper color filter, where a bottom surface of the organic layer has an uneven structure, and a top surface of the organic layer is a flat surface.

In an embodiment, the organic encapsulation layer included in the first thin-film encapsulation layer may include a blue pigment or dye.

In an embodiment, a display apparatus includes a substrate, a first sub-pixel, a second sub-pixel, and a third sub-pixel which are disposed on the substrate and respectively emit different colors, a plurality of light-emitting devices disposed on the substrate and respectively overlapping the first sub-pixel through the third sub-pixel, a first thin-film encapsulation layer disposed on the plurality of light-emitting devices, a second thin-film encapsulation layer disposed on the first thin-film encapsulation layer, a bank layer disposed between the first thin-film encapsulation layer and the second thin-film encapsulation layer, and allowing a first opening corresponding to the first sub-pixel, a second opening corresponding to the second sub-pixel, and a third opening corresponding to the third sub-pixel to be defined by a partition wall, a functional layer including a first quantum dot layer filling the first opening, a second quantum dot layer filling the second opening, and a transmissive layer filling the third opening, and an upper color filter disposed on the bank layer, where the first thin-film encapsulation layer includes a first inorganic encapsulation layer, a second inorganic encapsulation layer on the first inorganic encapsulation layer, and an organic encapsulation layer disposed between the first inorganic encapsulation layer and the second inorganic encapsulation layer, where the organic encapsulation layer of the first thin-film encapsulation layer includes a blue pigment or dye.

In an embodiment, the upper color filter may include a first color filter corresponding to the first sub-pixel, a second color filter corresponding to the second sub-pixel, and a third color filter corresponding to the third sub-pixel.

In an embodiment, the second thin-film encapsulation layer may include at least one inorganic encapsulation layer and at least one organic encapsulation layer.

In an embodiment, each of the plurality of light-emitting devices may include a sub-pixel electrode, a counter electrode on the sub-pixel electrode, and an emission layer disposed between the sub-pixel electrode and the counter electrode.

In an embodiment, all of the plurality of light-emitting devices may emit blue light.

In an embodiment, the first quantum dot layer may convert light of a first wavelength into light of a second wavelength band, and the second quantum dot layer may convert light having a wavelength in the first wavelength band into light having a wavelength in a third wavelength band.

In an embodiment, at least two selected from among the first color filter, the second color filter, and the third color filter may overlap each other to define a light-blocking portion, where the light-blocking portion overlaps the partition wall of the bank layer.

In an embodiment, the first color filter may be a red color filter, the second color filter may be a green color filter, and the third color filter may be a blue color filter.

In an embodiment, the display apparatus may further include an organic layer covering the upper color filter, where a bottom surface of the organic layer has an uneven structure, and a top surface of the organic layer is a flat surface.

In an embodiment, the display apparatus may further include a lower color filter that is a blue color filter disposed between the first thin-film encapsulation layer and the bank layer to cover all of the first sub-pixel, the second sub-pixel, and the third sub-pixel.

BRIEF DESCRIPTION OF THE DRAWINGS

The above and other features and advantages of embodiments will be more apparent from the following description taken in conjunction with the accompanying drawings, in which.

DETAILED DESCRIPTION

Figure 1:
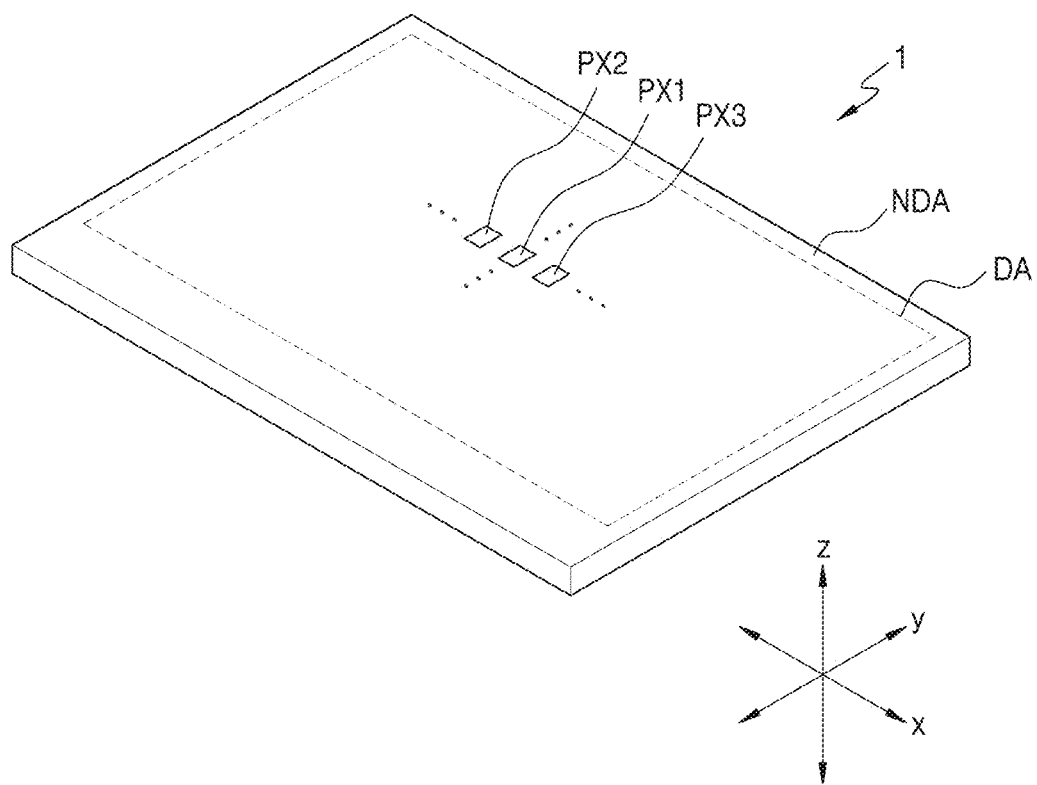
FIG. 1 is a perspective view schematically illustrating an embodiment of a display apparatus.

Reference will now be made in detail to embodiments, examples of which are illustrated in the accompanying drawings, where like reference numerals refer to like elements throughout. In this regard, the embodiments may have different forms and should not be construed as being limited to the descriptions set forth herein. Accordingly, the embodiments are merely described below, by referring to the drawing figures, to explain features of the description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, certain embodiments will be illustrated in the drawings and described in the detailed description. Effects and features of the disclosure, and methods for achieving them will be clarified with reference to embodiments described below in detail with reference to the drawings. However, the disclosure is not limited to the following embodiments and may be embodied in various forms.

Although the terms "first," "second," etc. may be used to describe various elements, these elements should not be limited by these terms. These terms are only used to distinguish one element from another.

As used herein, the singular forms "a," "an," and "the" are intended to include the plural forms as well, unless the context clearly indicates otherwise.

It will be further understood that the terms "comprises" or "comprising" used herein specify the presence of stated features or components, but do not preclude the presence or addition of one or more other features or components.

It will be further understood that, when a layer, region, or component is referred to as being "on" another layer, region, or component, it may be directly on the other layer, region, or component, or may be indirectly on the other layer, region, or component with intervening layers, regions, or components therebetween.

Sizes of components in the drawings may be exaggerated or contracted for convenience of explanation. Because sizes and thicknesses of elements in the drawings are arbitrarily illustrated for convenience of description, for example, the disclosure is not limited thereto.

"A and/or B" is used herein to select only A, select only B, or select both A and B. Also, "at least one of A and B" is used herein to select only A, select only B, or select both A and B.

In the following embodiments, when a wiring "extends in a first direction or a second direction," it may mean that the wiring extends not only in a linear shape but also in a zigzag or curved shape in the first direction or the second direction.

In the following embodiments, "a plan view of an object" refers to "a view of" an object seen from above, and "a cross-sectional view of an object" refers to "a view of" an object vertically cut and seen from the side. In the following embodiments, when elements "overlap," it may mean that the elements overlap in a "plan view" and a "cross-sectional view".

Hereinafter, embodiments will be described in detail with reference to the accompanying drawings, where the same or corresponding elements are denoted by the same reference numerals throughout.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within ±30%, 20%, 10%, 5% of the stated value, for example.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

FIG. 1 is a perspective view schematically illustrating an embodiment of a display apparatus.

Referring to FIG. 1, a display apparatus 1 includes a display area DA where an image is displayed and a non-display area NDA where an image is not displayed. The display apparatus 1 may provide an image through an array of sub-pixels P that are two-dimensionally arranged in an x-y plane in the display area DA. Each sub-pixel may emit light of a different color, and may be any one of a red sub-pixel, a green sub-pixel, and a blue sub-pixel, for example.

In an embodiment, the plurality of sub-pixels includes a first sub-pixel PX1, a second sub-pixel PX2, and a third sub-pixel PX3. For convenience of explanation, the following will be described assuming that the first sub-pixel PX1 is a red sub-pixel, the second sub-pixel PX2 is a green sub-pixel, and the third sub-pixel PX3 is a blue sub-pixel. The first sub-pixel PX1, the second sub-pixel PX2, and the third sub-pixel PX3 are areas for respectively emitting red light Lr, green light Lg, and blue light Lb, and the display apparatus 1 may provide an image by light emitted by the sub-pixels.

The non-display area NDA where an image is not provided may surround an entirety of the display area DA. A driver or a main voltage line for applying an electrical signal or power to pixel circuits may be disposed in the non-display area NDA. A pad to which an electronic device or a printed circuit board may be electrically connected may be included in the non-display area NDA.

The display area DA may have a polygonal shape including a quadrangular shape as shown in FIG. 1. In an embodiment, the display area DA may have a quadrangular (e.g., rectangular) shape in which a vertical length is greater than a horizontal length, may have a quadrangular (e.g., rectangular) shape in which a horizontal length is greater than a vertical length, or may have a square shape, for example. In another embodiment, the display area DA may have a circular shape, an elliptical shape, or a polygonal shape such as a triangular shape or a pentagonal shape. Also, although the display apparatus 1 of FIG. 1 is a flat panel display apparatus, the display apparatus 1 may be implemented as any of various apparatuses such as a flexible, foldable, or rollable display apparatus.

In an embodiment, the display apparatus 1 may be an organic light-emitting display apparatus. In another embodiment, the display apparatus 1 may be an inorganic light-emitting display apparatus or a quantum dot light-emitting display apparatus. In an embodiment, an emission layer of a display element included in the display apparatus may include an organic material, may include an inorganic material, may include quantum dots, may include an organic material and quantum dots, may include an inorganic material and quantum dots, or may include an organic material, an inorganic material, and quantum dots, for example. For convenience of explanation, the following will be described assuming that the display apparatus 1 is an organic light-emitting display apparatus.

Figure 2:
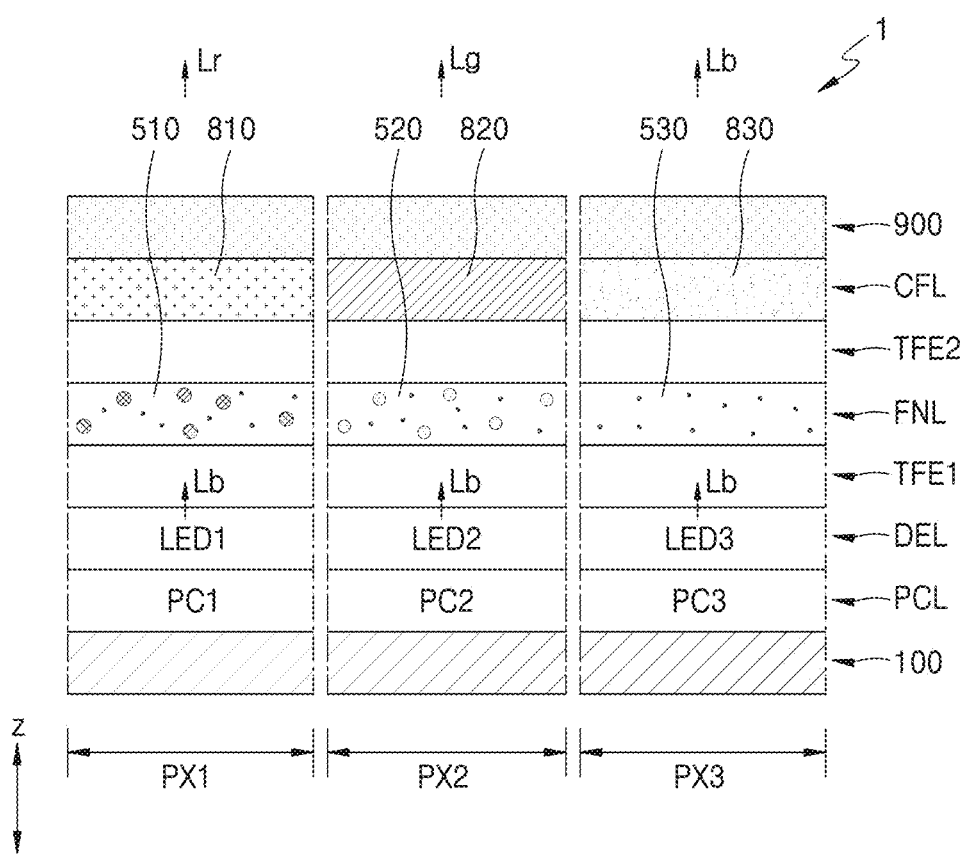
FIG. 2 is a cross-sectional view schematically illustrating an embodiment of a display apparatus.

FIG. 2 is a cross-sectional view schematically illustrating an embodiment of the display apparatus 1.

Referring to FIG. 2, the display apparatus 1 may include a circuit layer PCL on a substrate 100. The circuit layer PCL may include first through third sub-pixel circuits PC1, PC2, and PC3 and insulating layers, and each of the first through third sub-pixel circuits PC1, PC2, and PC3 may include a thin-film transistor and/or a capacitor. A display element layer DEL may include first through third light-emitting diodes LED1, LED2, and LED3 as display elements. The first through third sub-pixel circuits PC1, PC2, and PC3 may be respectively electrically connected to the first through third light-emitting diodes LED1, LED2, and LED3 of the display element layer DEL.

The first through third light-emitting diodes LED1, LED2, and LED3 may be organic light-emitting diodes including an organic material. In another embodiment, the first through third light-emitting diodes LED1, LED2, and LED3 may be inorganic light-emitting diodes including an inorganic material. The inorganic light-emitting diode may include a PN junction diode including inorganic semiconductor-based materials. When a voltage is applied to the PN junction diode in a forward direction, holes and electrons may be injected, and energy generated by recombination of the holes and electrons may be converted into light energy to emit light of a predetermined color. The inorganic light-emitting diode may have a width of several to hundreds of micrometers, or several to hundreds of nanometers. In some embodiments, the first through third light-emitting diodes LED1, LED2, and LED3 may be light-emitting diodes including quantum dots. As described above, an emission layer of the first through third light-emitting diodes LED1, LED2, and LED3 may include an organic material, may include an inorganic material, may include quantum dots, may include an organic material and quantum dots, or may include an inorganic material and quantum dots.

The first through third light-emitting diodes LED1, LED2, and LED3 may emit light of the same color. In an embodiment, the first through third light-emitting diodes LED1, LED2, and LED3 may emit blue light Lb, for example. However, the invention is not limited thereto. In another embodiment, the first through third light-emitting diodes LED1, LED2, and LED3 may emit light of different colors. The light (e.g., the blue light Lb) of the first through third light-emitting diodes LED1, LED2, and LED3 may pass through a first thin-film encapsulation layer TFE1 on the display element layer DEL and may pass through a functional layer FNL.

The functional layer FNL may include optical layers for transmitting the light (e.g., the blue light Lb) emitted by the display element layer DEL after converting or not converting a color of the light. In an embodiment, the functional layer FNL may include quantum dot layers for converting the light (e.g., the blue light Lb) emitted by the display element layer DEL into light of another color, and a transmissive layer for transmitting the light (e.g., the blue light Lb) emitted by the display element layer DEL without converting a color, for example. The functional layer FNL may include a first quantum dot layer 510 corresponding to the first sub-pixel PX1, a second quantum dot layer 520 corresponding to the second sub-pixel PX2, and a transmissive layer 530 corresponding to the third sub-pixel PX3. The first quantum dot layer 510 may covert the blue light Lb into red light Lr, and the second quantum dot layer 520 may convert the blue light Lb into green light Lg. The transmissive layer 530 may transmit the blue light Lb without converting the blue light Lb.

An upper color filter CFL may be disposed on the functional layer FNL. A second thin-film encapsulation layer TFE2 may be disposed between the functional layer FNL and the upper color filter CFL. The upper color filter CFL may include first through third color filters 810, 820, and 830 of different colors. In an embodiment, the first color filter 810 may be a red color filter, the second color filter 820 may be a green color filter, and the third color filter 830 may be a blue color filter.

Light converted and light transmitted by the functional layer FNL may have improved color purity while passing through the first through third color filters 810, 820, and 830. Also, the upper color filter CFL may prevent or minimize external light (e.g., light incident from the outside of the display apparatus 1 onto the display apparatus 1) from being reflected and visible to a user.

An overcoat layer 900 may be disposed on the upper color filter CFL. The overcoat layer 900 may include an organic material. In an embodiment, the overcoat layer 900 may include a light-transmitting organic material such as an acrylic resin, for example.

In an embodiment, after the functional layer FNL, the second thin-film encapsulation layer TFE2, and the upper color filter CFL are sequentially formed or disposed on the first thin-film encapsulation layer TFE1, the overcoat layer 900 may be directly applied and cured on the upper color filter CFL. In some embodiments, another optical film, e.g., an anti-reflection ("AR") film, may be disposed on the overcoat layer 900. Also, in some embodiments, a window (not shown) may be further disposed on the overcoat layer 900.

The display apparatus 1 having the above structure may include an electronic device capable of displaying a moving image or a still image such as a television, a billboard, a screen for a movie theater, a monitor, a tablet personal computer, or a laptop computer.

Figure 3:
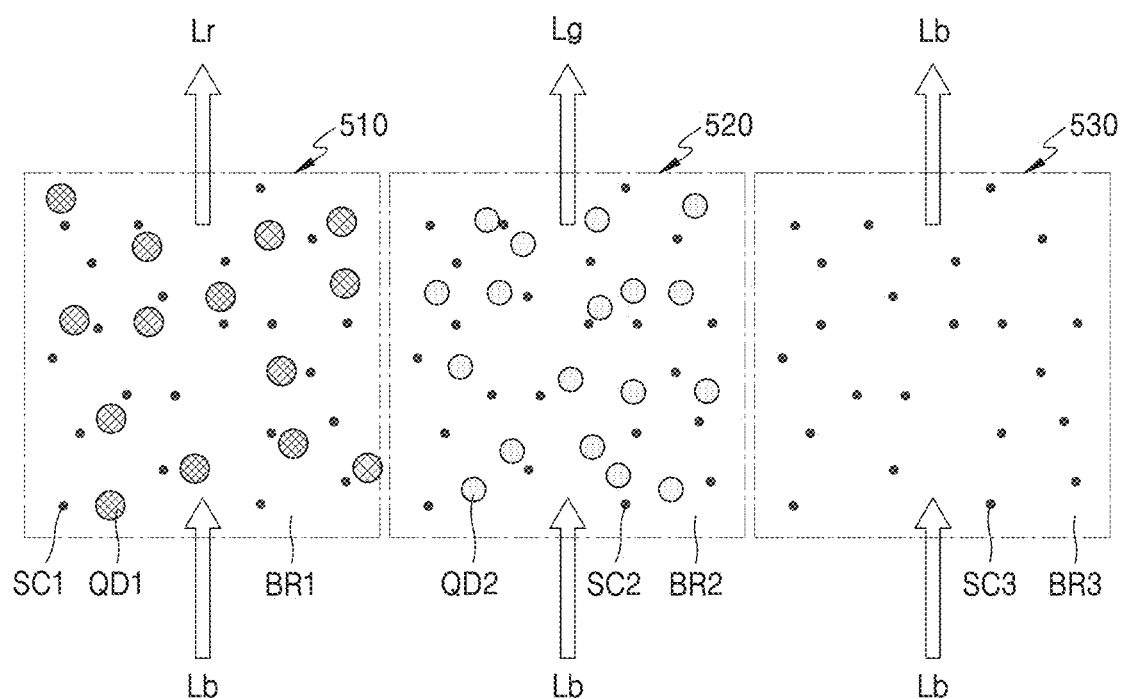
FIG. 3 is a view illustrating optical layers of a functional layer of FIG. 2.

FIG. 3 illustrates each of optical layers of the functional layer of FIG. 2.

Referring to FIG. 3, the first quantum dot layer 510 may convert the incident blue light Lb into the red light Lr. The first quantum dot layer 510 may include a first photosensitive polymer BR1, and first quantum dots QD1 and first scattering particles SC1 dispersed in the first photosensitive polymer BR1.

The first quantum dots QD1 may be excited by the blue light Lb to isotropically emit the red light Lr having a wavelength longer than a wavelength of the blue light. The first photosensitive polymer BR1 may be an organic material having light transmission properties. The first scattering particles SC1 may scatter the blue light Lb not absorbed by the first quantum dots QD1 so that more first quantum dots QD1 are excited, thereby improving color conversion efficiency. The first scattering particles SC1 may be, e.g., titanium oxide ($TiO_2$) or metal particles. The first quantum dots QD1 may include a group II-VI compound, a group III-V compound, a group IV-VI compound, a group IV element, a group IV compound, or any combinations thereof.

The second quantum dot layer 520 may convert the blue light Lb into the green light Lg. The second quantum dot layer 520 may include a second photosensitive polymer BR2, and second quantum dots QD2 and second scattering particles SC2 dispersed in the second photosensitive polymer BR2, as shown in FIG. 3.

The second quantum dots QD2 may be excited by the blue light Lb to isotropically emit the green light Lg having a wavelength longer than a wavelength of the blue light. The second photosensitive polymer BR2 may be an organic material having light transmission properties.

The second scattering particles SC2 may scatter the blue light Lb not absorbed by the second quantum dots QD2 so that more second quantum dots QD2 are excited, thereby improving color conversion efficiency. The second scattering particles SC2 may be, e.g., titanium oxide ($TiO_2$) or metal particles. The second quantum dots QD2 may include a group II-VI compound, a group III-V compound, a group IV-VI compound, a group IV element, a group IV compound, or any combinations thereof.

In some embodiments, the first quantum dots QD1 and the second quantum dots QD2 may be the same material. In this case, sizes of the second quantum dots QD2 may be greater than those of the first quantum dots QD1.

The transmissive layer 530 may transmit the blue light Lb without converting the blue light Lb incident on the transmissive layer 530. The transmissive layer 530 may include a third photosensitive polymer BR3 in which third scattering particles SC3 are dispersed, as shown in FIG. 3. The third photosensitive polymer BR3 may be an organic material having light transmission properties such as silicone resin or epoxy resin, and may be the same material as that of the first and second photosensitive polymers BR1 and BR2. The third scattering particles SC3 may scatter and emit the blue light Lb, and may be the same material as that of the first and second scattering particles SC1 and SC2.

Figure 4:
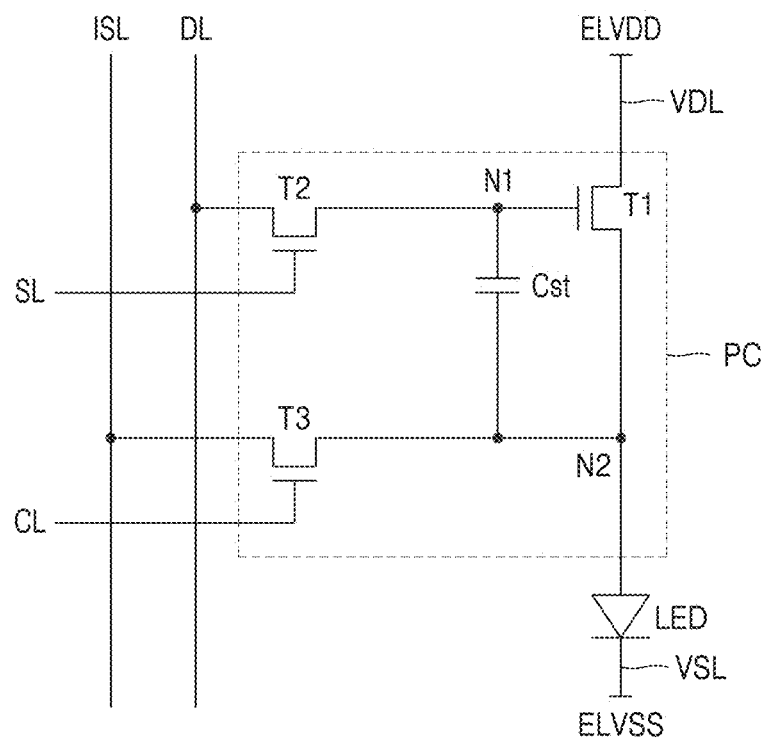
FIG. 4 is an equivalent circuit diagram schematically illustrating an embodiment of a pixel provided in a display apparatus.

FIG. 4 is an equivalent circuit diagram illustrating an embodiment of a light-emitting diode included in a display apparatus and a sub-pixel circuit electrically connected to the light-emitting diode. A sub-pixel circuit PC of FIG. 4 may correspond to each of the first through third sub-pixel circuits PC1, PC2, and PC3 described with reference to FIG. 2, and a light-emitting diode LED of FIG. 4 may correspond to each of the first through third light-emitting diodes LED1, LED2, and LED3 described with reference to FIG. 2.

Referring to FIG. 4, the light-emitting diode, e.g., a sub-pixel electrode (e.g., anode) of the light-emitting diode LED, may be connected to the sub-pixel circuit PC, and a counter electrode (e.g., cathode) of the light-emitting diode LED may be connected to a common voltage line VSL for providing a common voltage ELVSS or an auxiliary wiring (not shown). The light-emitting diode LED may emit light with a luminance corresponding to the amount of current supplied from the sub-pixel circuit PC.

The sub-pixel circuit PC may control the amount of current flowing from a driving voltage ELVDD via the light-emitting diode LED to the common voltage ELVSS in response to a data signal. The sub-pixel circuit PC may include a first thin-film transistor T1, a second thin-film transistor T2, a third thin-film transistor T3, and a storage capacitor Cst.

Each of the first thin-film transistor T1, the second thin-film transistor T2, and the third thin-film transistor T3 may be an oxide semiconductor transistor including a semiconductor layer including an oxide semiconductor, or may be a silicon semiconductor transistor including a semiconductor layer including polysilicon. According to a type of a thin-film transistor, a first electrode may be one of a source electrode and a drain electrode, and a second electrode may be the remaining one of the source electrode and the drain electrode.

The first thin-film transistor T1 may be a driving thin-film transistor. A first electrode of the first thin-film transistor T1 may be connected to a driving voltage line VDL that supplies the driving voltage ELVDD, and a second electrode of the first thin-film transistor T1 may be connected to the sub-pixel electrode of the light-emitting diode LED. A gate electrode of the first thin-film transistor T1 may be connected to a first node N1. The first thin-film transistor T1 may control the amount of current flowing through the light-emitting diode LED from the driving voltage ELVDD in response to a voltage of the first node N1.

The second thin-film transistor T2 may be a switching thin-film transistor. A first electrode of the second thin-film transistor T2 may be connected to a data line DL, and a second electrode of the second thin-film transistor T2 may be connected to the first node N1. A gate electrode of the second thin-film transistor T2 may be connected to a scan line SL. The second thin-film transistor T2 may be turned on when a scan signal is applied through the scan line SL, to electrically connect the data line DL to the first node N1.

The third thin-film transistor T3 may be an initialization thin-film transistor and/or a sensing thin-film transistor. A first electrode of the third thin-film transistor T3 may be connected to a second node N2, and a second electrode of the third thin-film transistor T3 may be connected to a sensing line ISL. A gate electrode of the third thin-film transistor T3 may be connected to a control line CL.

The storage capacitor Cst may be connected between the first node N1 and the second node N2. In an embodiment, a first capacitor electrode of the storage capacitor Cst may be connected to the gate electrode of the first thin-film transistor T1, and a second capacitor electrode of the storage capacitor Cst may be connected to the sub-pixel electrode of the light-emitting diode LED, for example.

Although the first thin-film transistor T1, the second thin-film transistor T2, and the third thin-film transistor T3 are n-channel metal-oxide-semiconductor ("NMOS") transistors in FIG. 4, the invention is not limited thereto. In an embodiment, at least one of the first thin-film transistor T1, the second thin-film transistor T2, and the third thin-film transistor T3 may be a p-channel metal-oxide-semiconductor ("PMOS") transistor, for example.

Although three thin-film transistors are illustrated in FIG. 4, the invention is not limited thereto. The sub-pixel circuit PC may include four or more thin-film transistors.

Figure 5:
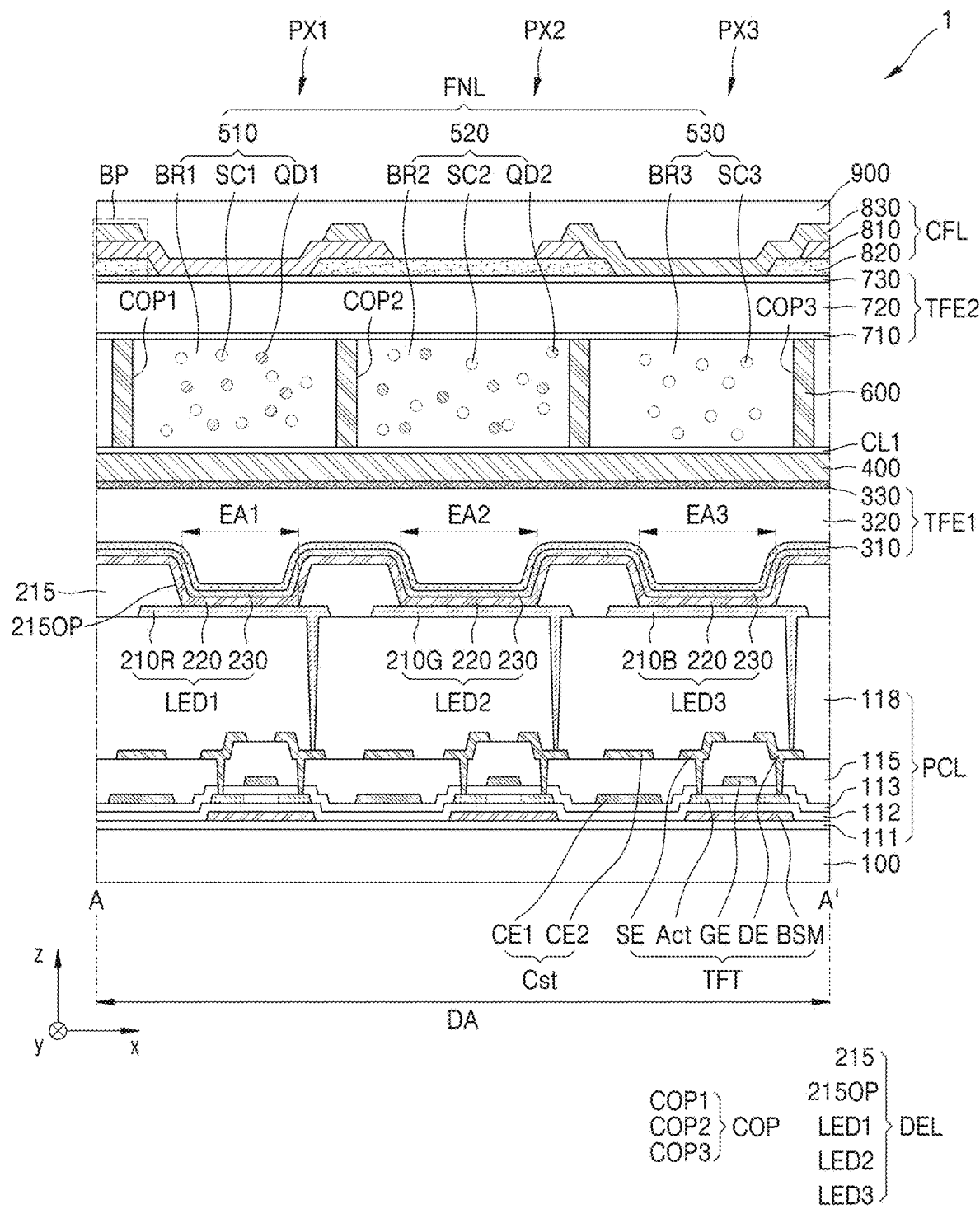
FIG. 5 is a cross-sectional view schematically illustrating an embodiment of a display apparatus.

FIG. 5 is a cross-sectional view schematically illustrating an embodiment of a display apparatus. Referring to FIG. 5, the display apparatus 1 may include the first sub-pixel PX1, the second sub-pixel PX2, and the third sub-pixel PX3 for emitting light of different colors, and the first sub-pixel PX1 may emit the red light Lr (refer to FIGS. 2 and 3), the second sub-pixel PX2 may emit the green light Lg (refer to FIGS. 2 and 3), and the third sub-pixel PX3 may emit the blue light Lb (refer to FIGS. 2 and 3).

The display apparatus 1 may include the substrate 100, and a stacked structure of the circuit layer PCL, the display element layer DEL, a lower color filter 400, the functional layer FNL, and the upper color filter CFL on the substrate 100. The display element layer DEL may include the first through third light-emitting diodes LED1, LED2, and LED3 electrically connected to sub-pixel circuits of the circuit layer PCL. The circuit layer PCL may include a plurality of sub-pixel circuits respectively corresponding to the first through third sub-pixels PX1, PX2, and PX3, and the sub-pixel circuit may include a plurality of thin-film transistors TFT and the storage capacitor Cst as described with reference to FIG. 4. In an embodiment, the thin-film transistor TFT may be the driving thin-film transistor T1 (refer to FIG. 4), for example.

The substrate 100 may include glass or a polymer resin. In this case, the polymer resin may include at least one of polyethersulfone, polyarylate, polyether imide, polyethylene naphthalate, polyethylene terephthalate, polyphenylene sulfide, polyimide, polycarbonate, cellulose triacetate, and cellulose acetate propionate. The substrate 100 may have a single or multi-layer structure including the above material.

In an embodiment, the substrate 100 may have a structure including an organic material, an inorganic material, and an organic material.

The circuit layer PCL may be disposed on the substrate 100. In FIG. 5, the circuit layer PCL includes the thin-film transistor TFT and the storage capacitor Cst, and a first buffer layer 111, a second buffer layer 112, a gate insulating layer 113, an inter-insulating layer 115, and a planarization layer 118 disposed under and/or over the thin-film transistor TFT and the storage capacitor Cst.

The first buffer layer 111 and the second buffer layer 112 may reduce or block penetration of a foreign material, moisture, or external air from the bottom of the substrate 100. Each of the first buffer layer 111 and the second buffer layer 112 may include an inorganic insulating material such as silicon nitride, silicon oxynitride, or silicon oxide, and may have a single or multi-layer structure including the above inorganic insulating material.

A bias electrode BSM may be disposed on the first buffer layer 111 to correspond to the thin-film transistor TFT. In an embodiment, a voltage may be applied to the bias electrode BSM. Also, the bias electrode BSM may prevent external light from reaching a semiconductor layer Act. Accordingly, the characteristics of the thin-film transistor TFT may be stabilized. In some embodiments, the bias electrode BSM may be omitted.

The semiconductor layer Act may be disposed on the second buffer layer 112. The semiconductor layer Act may include amorphous silicon or polysilicon. In another embodiment, the semiconductor layer Act may include an oxide of at least one material including indium (In), gallium (Ga), tin (Sn), zirconium (Zr), vanadium (V), hafnium (Hf), cadmium (Cd), germanium (Ge), chromium (Cr), titanium (Ti), aluminum (Al), cesium (Cs), cerium (Ce), zinc (Zn) or any combinations thereof. In some embodiments, the semiconductor layer Act may include a Zn oxide-based material such as Zn oxide, In—Zn oxide, or Ga—In—Zn oxide. In some embodiments, the semiconductor layer Act may include an In—Ga—Zn—O ("IGZO"), In—Sn—Zn—O ("ITZO"), or In—Ga—Sn—Zn—O ("IGTZO") semiconductor including a metal such as indium (In), gallium (Ga), or tin (Sn) in ZnO. The semiconductor layer Act may include a channel region, and a source region and a drain region disposed on opposite sides of the channel region. A gate electrode GE may overlap the channel region of the semiconductor layer Act.

The gate electrode GE may include a low-resistance metal material. The gate electrode GE may include a conductive material such as molybdenum (Mo), aluminum (Al), copper (Cu), or titanium (Ti), and may have a single or multi-layer structure including the above material.

The gate insulating layer 113 may be disposed between the semiconductor layer Act and the gate electrode GE. The gate insulating layer 113 may include an inorganic insulating material such as silicon oxide, silicon nitride, silicon oxynitride, aluminum oxide, titanium oxide, tantalum oxide, hafnium oxide, or zinc oxide.

A first electrode CE1 of the storage capacitor Cst may be disposed in the same layer as the gate electrode GE. The first electrode CE1 and the gate electrode GE may include the same material. Although the gate electrode GE of the thin-film transistor TFT and the first electrode CE1 of the storage capacitor Cst are separately disposed in FIG. 5, in another embodiment, the storage capacitor Cst may overlap the thin-film transistor TFT. In this case, the gate electrode GE of the thin-film transistor TFT may function as the first electrode CE1 of the storage capacitor Cst.

The inter-insulating layer 115 may cover the gate electrode GE. The inter-insulating layer 115 may include an inorganic insulating material such as silicon oxide, silicon nitride, silicon oxynitride, aluminum oxide, titanium oxide, tantalum oxide, hafnium oxide, or zinc oxide.

A second electrode CE2 of the storage capacitor Cst, a source electrode SE, and a drain electrode DE may be disposed on the inter-insulating layer 115.

Each of the second electrode CE2 of the storage capacitor Cst, the source electrode SE, and the drain electrode DE may include a conductive material including molybdenum (Mo), aluminum (Al), copper (Cu), or titanium (Ti), and may have a single or multi-layer structure including the above material. In an embodiment, the second electrode CE2 of the storage capacitor Cst, the source electrode SE, and the drain electrode DE may have a multi-layer structure including Ti/Al/Ti, for example. The source electrode SE and the drain electrode DE may be respectively connected to the source region or the drain region of the semiconductor layer Act through a contact hole.

The second electrode CE2 and the first electrode CE1 of the storage capacitor Cst overlap each other with the inter-insulating layer 115 therebetween to constitute the storage capacitor Cst. In this case, the inter-insulating layer 115 may function as a dielectric layer of the storage capacitor Cst.

The planarization layer 118 may cover the second electrode CE2 of the storage capacitor Cst, the source electrode SE, and the drain electrode DE. The planarization layer 118 may have a single or multi-layer structure including an organic material, and may provide a flat top surface. The planarization layer 118 may include benzocyclobutene ("BCB"), polyimide, hexamethyldisiloxane ("HMDSO"), a general-purpose polymer such as polymethyl methacrylate ("PMMA") or polystyrene ("PS"), a polymer derivative having a phenol-based group, an acrylic polymer, an imide-based polymer, an aryl ether-based polymer, an amide-based polymer, a fluorinated polymer, a p-xylene-based polymer, a vinyl alcohol-based polymer, or any combinations thereof.

The display element layer DEL may be disposed on the circuit layer PCL having the above structure. The display element layer DEL may include the first through third light-emitting diodes LED1, LED2, and LED3 that are organic light-emitting diodes as display elements. The first light-emitting diode LED1, the second light-emitting diode LED2, and the third light-emitting diode LED3 may respectively include a first sub-pixel electrode 210R, a second sub-pixel electrode 210G, and a third sub-pixel electrode 210B. In an embodiment, the first light-emitting diode LED1, the second light-emitting diode LED2, and the third light-emitting diode LED3 may commonly include an emission layer 220 and a counter electrode 230.

Each of the first sub-pixel electrode 210R, the second sub-pixel electrode 210G, and the third sub-pixel electrode 210B may be a (semi)light-transmitting electrode or a reflective electrode. In some embodiments, each of the first sub-pixel electrode 210R, the second sub-pixel electrode 210G, and the third sub-pixel electrode 210B may include a conductive oxide such as indium tin oxide ("ITO"), indium zinc oxide ("IZO"), zinc oxide (ZnO), indium oxide ($In_2O_3$), indium gallium oxide ("IGO"), or aluminum zinc oxide ("AZO"). In an embodiment, each of the first sub-pixel electrode 210R, the second sub-pixel electrode 210G, and the third sub-pixel electrode 210B may include a reflective film including silver (Ag), magnesium (Mg), aluminum (Al), platinum (Pt), palladium (Pd), gold (Au), nickel (Ni), neodymium (Nd), iridium (Ir), chromium (Cr), or any combinations thereof. In an alternative embodiment, each of the first sub-pixel electrode 210R, the second sub-pixel electrode 210G, and the third sub-pixel electrode 210B may further include a film including ITO, IZO, ZnO, or In203 over/under the reflective film. In an embodiment, the first sub-pixel electrode 210R, the second sub-pixel electrode 210G, and the third sub-pixel electrode 210B may include ITO/Ag/ITO, for example.

A first bank layer 215 may be disposed on the planarization layer 118. An opening 215OP through which a central portion of each of the first sub-pixel electrode 210R, the second sub-pixel electrode 210G, and the third sub-pixel electrode 2108 is exposed may be defined in the first bank layer 215. The first bank layer 215 may cover edges of the first sub-pixel electrode 210R, the second sub-pixel electrode 210G, and the third sub-pixel electrode 2108. The first bank layer 215 may increase a distance between the edges of the first sub-pixel electrode 210R, the second sub-pixel electrode 210G, and the third sub-pixel electrode 2108 and the counter electrode 230 over the first sub-pixel electrode 210R, the second sub-pixel electrode 210G, and the third sub-pixel electrode 210B, to prevent an arc or the like from occurring on the edges of the first sub-pixel electrode 210R, the second sub-pixel electrode 210G, and the third sub-pixel electrode 210B.

The first bank layer 215 may include at least one organic insulating material including polyimide, polyamide, acrylic resin, benzocyclobutene, phenolic resin or any combinations thereof.

The emission layer 220 of the first light-emitting diode LED1, the second light-emitting diode LED2, and the third light-emitting diode LED3 may include an organic material including a fluorescent or phosphorescent material that emits red, green, blue, or white light. The emission layer 220 may include a low molecular weight organic material or a high molecular weight organic material, and functional layers such as a hole transport layer ("HTL"), a hole injection layer ("HIL"), an electron transport layer ("ETL"), and an electron injection layer ("EIL") may be selectively disposed under and over the emission layer 220. The emission layer 220 may be unitary over the first sub-pixel electrode 210R, the second sub-pixel electrode 210G, and the third sub-pixel electrode 2108 as shown in FIG. 5, but the invention is not limited thereto. In some embodiments, the emission layer 220 may include a layer patterned to correspond to each of the first sub-pixel electrode 210R, the second sub-pixel electrode 210G, and the third sub-pixel electrode 210B. In any case, the emission layer 220 may be a first color emission layer. The first color emission layer may emit light of a first wavelength band, e.g., blue light. In an embodiment, the emission layer 220 may emit light having a wavelength ranging from about 450 nanometer (nm) to about 495 nm.

The counter electrode 230 may be disposed on the emission layer 220, and may correspond to the first sub-pixel electrode 210R, the second sub-pixel electrode 210G, and the third sub-pixel electrode 210B. The counter electrode 230 may be unitary over the first sub-pixel electrode 210R, the second sub-pixel electrode 210G, and the third sub-pixel electrode 2108. In an embodiment, the counter electrode 230 may include a conductive material having a low work function. In an embodiment, the counter electrode 230 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof, for example. In an alternative embodiment, the counter electrode 230 may further include a layer such as ITO, IZO, ZnO, or $In_2O_3$ on the (semi)transparent layer including the above material.

First through third emission areas EA1, EA2, and EA3 may respectively correspond to the first through third sub-pixels PX1, PX2, and PX3. The first through third emission areas EA1, EA2, and EA3 may be areas where light generated in the first through third light-emitting diodes LED1, LED2, and LED3 is emitted. The first emission area EA1 may be defined as a portion of the first sub-pixel electrode 210R exposed by the opening 215OP of the first bank layer 215. The second emission area EA2 may be defined as a portion of the second sub-pixel electrode 210G exposed by the opening 215OP of the first bank layer 215. The third emission area EA3 may be defined as a portion of the third sub-pixel electrode 210B exposed by the opening 215OP of the first bank layer 215. In other words, the first emission area EA1, the second emission area EA2, and the third emission area EA3 may be defined by the openings 215OP of the first bank layer 215.

The first emission area EA1, the second emission area EA2, and the third emission area EA3 may be spaced apart from one another. A portion of the display area DA other than the first emission area EA1, the second emission area EA2, and the third emission area EA3 may be a non-emission area. The first emission area EA1, the second emission area EA2, and the third emission area EA3 may be divided by the non-emission area.

A spacer (not shown) for preventing damage to a mask may be further provided on the first bank layer 215. In an embodiment, the spacer may be unitary with the first bank layer 215. In an embodiment, the spacer and the first bank layer 215 may be simultaneously formed in the same process by a halftone mask process, for example.

The first thin-film encapsulation layer TFE1 may cover the display element layer DEL. Because the first light-emitting diode LED1, the second light-emitting diode LED2, and the third light-emitting diode LED3 may be easily damaged by external moisture, oxygen, or the like, the first light-emitting diode LED1, the second light-emitting diode LED2, and the third light-emitting diode LED3 may be covered and protected by the first thin-film encapsulation layer TFE1. The first thin-film encapsulation layer TFE1 may cover the display area DA and may extend to the outside of the display area DA. The first thin-film encapsulation layer TFE1 may include at least one organic encapsulation layer and at least one inorganic encapsulation layer. In an embodiment, the first thin-film encapsulation layer TFE1 may include a first inorganic encapsulation layer 310, a first organic encapsulation layer 320, and a second inorganic encapsulation layer 330 that are sequentially stacked, for example.

Each of the first and second inorganic encapsulation layers 310 and 330 may include at least one inorganic material from among aluminum oxide, titanium oxide, tantalum oxide, hafnium oxide, zinc oxide, silicon oxide, silicon nitride, and silicon oxynitride. The first organic encapsulation layer 320 may include a polymer-based material. In an embodiment, the polymer-based material may include an acrylic resin, an epoxy resin, polyimide, or polyethylene. In an embodiment, the first organic encapsulation layer 320 may include acrylate. The first organic encapsulation layer 320 may be formed by curing a monomer or applying a polymer.

Because the first thin-film encapsulation layer TFE1 has the above multi-layer structure, even when cracks occur in the first thin-film encapsulation layer TFE1, the cracks may not spread between the first inorganic encapsulation layer 310 and the first organic encapsulation layer 320 or between the first organic encapsulation layer 320 and the second inorganic encapsulation layer 330. The formation of a path through which external moisture or oxygen penetrates into the display area DA may be prevented or minimized.

In some embodiments, other layers such as a capping layer may be further disposed between the first inorganic encapsulation layer 310 and the counter electrode 230.

The lower color filter 400 may be disposed on the first thin-film encapsulation layer TFE1. The lower color filter 400 may cover all of the first sub-pixel PX1, the second sub-pixel PX2, and the third sub-pixel PX3. In an embodiment, the lower color filter 400 may be unitary over the first sub-pixel electrode 210R, the second sub-pixel electrode 210G, and the third sub-pixel electrode 210B, for example. In some embodiments, the lower color filter 400 may extend to the outside of the display area DA and may cover at least a part of the non-display area NDA. In some embodiments, the lower color filter 400 may be unitary over the substrate 100 to cover the display area DA.

The lower color filter 400 may reduce the reflection of external air of the display apparatus 1 along with the upper color filter CFL described below. In an embodiment, when external light reaches the lower color filter 400, only light having a preset wavelength may pass through the lower color filter 400 and light having other wavelengths may be absorbed by the lower color filter 400, for example. The lower color filter 400 may pass only light emitted by a plurality of light-emitting diodes, e.g., the first through third light-emitting diodes LED1, LED2, and LED3. In an embodiment, the first through third light-emitting diodes LED1, LED2, and LED3 may emit blue light, and the lower color filter 400 may be a blue color filter, for example. The lower color filter 400 may be a layer through which only light having a wavelength ranging from about 450 nm to about 495 nm passes.

When external light incident on the display apparatus 1 reaches the first quantum dot layer 510 and/or the second quantum dot layer 520, part of the light may excite quantum dots, and may be converted into light of another wavelength band and may be reflected. When the reflection of light due to external light reaching the quantum dot layer increases, an undesired color may be reproduced, thereby affecting a luminance of the display apparatus 1.

However, in embodiments, the lower color filter 400 may re-absorb part of light passing through the upper color filter CFL from among external light incident on the display apparatus 1 or part of light reflected by the counter electrode 230 and/or the first through third sub-pixel electrodes 210R, 210G, and 210B disposed under the lower color filter 400, thereby reducing a ratio of reflected light emitted to the outside. Also, the lower color filter 400 may minimize part of the reflected light from reaching the functional layer FNL, e.g., the first and second quantum dot layers 510 and 520.

In an embodiment, at a position corresponding to the first sub-pixel PX1, part of light (e.g., red light) incident on the display apparatus 1 and passing through the first color filter 810 may be absorbed by the lower color filter 400 that is a blue color filter before or after being reflected by the first sub-pixel electrode 210R and/or the counter electrode 230, for example.

Also, at a position corresponding to the second sub-pixel PX2, part of light (e.g., green light) incident on the display apparatus 1 and passing through the second color filter 820 may be absorbed by the lower color filter 400 that is a blue color filter before or after being reflected by the second sub-pixel electrode 210G and/or the counter electrode 230.

At a position corresponding to the third sub-pixel PX3, light (e.g., blue light) incident on the display apparatus 1 and passing through the third color filter 830 may pass through the lower color filter 400 that is a blue color filter, but in this case, the lower color filter 400 may prevent light of a different color incident through the first and second sub-pixels PX1 and PX2 from being reflected by a lower metal layer and emitted from the third sub-pixel PX3.

A first capping layer CL1 may be disposed between the lower color filter 400 and a second bank layer 600 and between the lower color filter 400 and the functional layer FNL. The first capping layer CL1 may protect the lower color filter 400. The first capping layer CL1 may prevent or reduce damage or contamination of the lower color filter 400 due to penetration of a foreign material such as external moisture and/or air. The first capping layer CL1 may include an inorganic material. In some embodiments, the first capping layer CL1 may be omitted.

The second bank layer 600 may be disposed on the first capping layer CL1. The second bank layer 600 may include an organic material or an inorganic material. In an embodiment, the second bank layer 600 may include an inorganic material such as silicon oxide, silicon nitride, and/or silicon oxynitride, for example. When desired, the second bank layer 600 may include a light-blocking material to function as a light-blocking layer. The light-blocking material may include at least one of, e.g., a black pigment, a black dye, black particles, and metal particles.

Openings COP may be defined by partial walls in the second bank layer 600. A first opening COP1 of the second bank layer 600 may correspond to the opening 215OP of the first bank layer 215 through which the first sub-pixel electrode 210R is exposed, a second opening COP2 of the second bank layer 600 may correspond to the opening 215OP of the first bank layer 215 through which the second sub-pixel electrode 210G is exposed, and a third opening COP3 of the second bank layer 600 may correspond to the opening 215OP of the first bank layer 215 through which the third sub-pixel electrode 210B is exposed. That is, when viewed in a direction (z-axis direction) perpendicular to the substrate 100, the first opening COP1 of the second bank layer 600 may overlap the opening 215OP of the first bank layer 215 through which the first sub-pixel electrode 210R is exposed, the second opening COP2 of the second bank layer 600 may overlap the opening 215OP of the first bank layer 215 through which the second sub-pixel electrode 210G is exposed, and the third opening COP3 of the second bank layer 600 may overlap the opening 215OP of the first bank layer 215 through which the third sub-pixel electrode 210G is exposed. A partition wall may be disposed between the first opening COP1, the second opening COP2, and the third opening COP3 of the second bank layer 600.

The functional layer FNL may fill the openings COP of the second bank layer 600. In an embodiment, the functional layer FNL may include at least one of quantum dots and scattering particles. The functional layer FNL may include the first quantum dot layer 510, the second quantum dot layer 520, and the transmissive layer 530.

The first quantum dot layer 510 may fill the first opening COP1 of the second bank layer 600. The first quantum dot layer 510 may overlap the first emission area EA1. The first sub-pixel PX1 may include the first light-emitting diode LED1 and the first quantum dot layer 510.

The first quantum dot layer 510 may convert light of a first wavelength band generated by the emission layer 220 on the first sub-pixel electrode 210R into light of a second wavelength band. The first quantum dot layer 510 may convert blue light into red light. In an embodiment, when light having a wavelength ranging from about 450 nm to about 495 nm is generated by the emission layer 220 on the first sub-pixel electrode 210R, the first quantum dot layer 510 may convert the light into light having a wavelength ranging from about 630 nm to about 780 nm, for example. Accordingly, in the first sub-pixel PX1, the light having the wavelength ranging from about 630 nm to about 780 nm may be emitted to the outside.

The first quantum dot layer 510 may include the first photosensitive polymer BR1, and the first quantum dots QD1 and the first scattering particles SC1 dispersed in the first photosensitive polymer BR1.

The second quantum dot layer 520 may fill the second opening COP2 of the second bank layer 600. The second quantum dot layer 520 may overlap the second emission area EA2. The second sub-pixel PX2 may include the second light-emitting diode LED2 and the second quantum dot layer 520.

The second quantum dot layer 520 may convert light of a first wavelength band generated by the emission layer 220 on the second sub-pixel electrode 210G into light of a third wavelength band. The second quantum dot layer 520 may convert blue light into green light. In an embodiment, when light having a wavelength ranging from about 450 nm to about 495 nm is generated by the emission layer 220 on the second sub-pixel electrode 210G, the second quantum dot layer 520 may convert the light into light having a wavelength ranging from about 495 nm to about 570 nm, for example. Accordingly, in the second sub-pixel PX2, the light having the wavelength ranging from about 495 nm to about 570 nm may be emitted to the outside.

The second quantum dot layer 520 may include the second photosensitive polymer BR2, and the second quantum dots QD2 and the second scattering particles SC2 dispersed in the second photosensitive polymer BR2.

The transmissive layer 530 may fill the third opening COP3 of the second bank layer 600. The transmissive layer 530 may overlap the third emission area EA3. The third sub-pixel PX3 may include the third light-emitting diode LED3 and the transmissive layer 530.

The transmissive layer 530 may emit light generated by the emission layer 220 on the third sub-pixel electrode 210B to the outside without converting a wavelength. The transmissive layer 530 may pass blue light without converting the blue light. In an embodiment, when light having a wavelength ranging from about 450 nm to about 495 nm is generated by the emission layer 220 on the third sub-pixel electrode 210B, the transmissive layer 530 may emit the light to the outside without converting a wavelength, for example.

The transmissive layer 530 may include the third photosensitive polymer BR3 in which the third scattering particles SC3 are dispersed. In an embodiment, the transmissive layer 530 may not include quantum dots.

At least one of first quantum dots QD1 and second quantum dots QD2 may include a semiconductor material such as cadmium sulfide (CdS), cadmium telleride (CdTe), zinc sulfide (ZnS), or indium phosphide (InP). The quantum dots may have a size of several nanometers, and a wavelength of light after conversion may vary according to the size of the quantum dots.

In an embodiment, a core of a quantum dot may include a group II-VI compound, a group III-V compound, a group IV-VI compound, a group IV element, a group IV compound, or any combinations thereof.

The group II-VI compound may include a binary compound including CdSe, CdTe, ZnS, ZnSe, ZnTe, ZnO, HgS, HgSe, HgTe, MgSe, MgS, or any combinations thereof, a ternary compound including AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or any combinations thereof, and a quaternary compound including HgZnTeS, CdZnSeS, CdZnSeTe, CdZnSTe, CdHgSeS, CdHgSeTe, CdHgSTe, HgZnSeS, HgZnSeTe, HgZnSTe, or any combinations thereof.

The group III-V compound may include a binary compound including GaN, GaP, GaAs, GaSb, AlN, AlP, AlAs, AlSb, InN, InP, InAs, InSb, or any combinations thereof, a ternary compound including GaNP, GaNAs, GaNSb, GaPAs, GaPSb, AlNP, AlNAs, AlNSb, AlPAs, AlPSb, InGaP, InNP, InNAs, InNSb, InPAs, InPSb, GaAlNP, or any combinations thereof, and a quaternary compound including GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or any combinations thereof.

The group IV-VI compound may include a binary compound including SnS, SnSe, SnTe, PbS, PbSe, PbTe, or any combinations thereof, a ternary compound including SnSeS, SnSeTe, SnSTe, PbSeS, PbSeTe, PbSTe, SnPbS, SnPbSe, SnPbTe, or any combinations thereof, and a quaternary compound including SnPbSSe, SnPbSeTe, SnPbSTe, or any combinations thereof. The group IV element may include silicon (Si), germanium (Ge), or a combination thereof. The group IV compound may be a binary compound including SiC, SiGe, or a combination thereof.

In this case, the binary compound, the ternary compound, or the quaternary compound may exist in particles at a uniform concentration, or may exist in the same particle divided into two states where concentration distributions are partially different. Also, the quantum dot may have a core/shell structure in which one quantum dot surrounds another quantum dot. An interface between the core and the shell may have a concentration gradient in which a concentration of an element in the shell gradually decreases toward the center.

In some embodiments, a quantum dot may have a core-shell structure including a core and a shell surrounding the core. The shell of the quantum dot may function as a protective layer for maintaining semiconductor characteristics by preventing chemical denaturation of the core and/or a charging layer for giving electrophoretic characteristics to the quantum dot. The shell may have a single or multi-layer structure. An interface between the core and the shell may have a concentration gradient in which a concentration of an element in the shell gradually decreases toward the center. In an embodiment, the shell of the quantum dot may include an oxide of a metal or a non-metal, a semiconductor compound, and any combinations thereof.

In an embodiment, the oxide of the metal or the non-metal may include, but are not limited to, a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO and a ternary compound such as $MgAl_2O_4$, $CoFe_2O_4$, $NiFe_2O_4$, or $CoMn_2O_4$.

In an embodiment, the semiconductor compound may include, but is not limited to, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, or AlSb.

In an embodiment, a quantum dot may have a full width at half maximum ("FWHM") of an emission wavelength spectrum of about 45 nm or less, preferably about 40 nm or less, and more preferably about 30 nm or less. In this range, color purity or color reproducibility may be improved. Also, because light emitted through the quantum dot is emitted in all directions, an optical viewing angle may be improved.

Also, a quantum dot may have a shape that is generally used in the art but is not particularly limited thereto. More specifically, a quantum dot may be a spherical, pyramid, multi-arm, or cubic-shaped nano particle, nano-tube, nano-wire, nano-fiber, or nano-plate particle.

A color of light emitted from the quantum dot may be controlled according to a particle size, and thus the quantum dot may have any of various emission colors such as blue, red, or green.

The first scattering particles SC1, the second scattering particles SC2, and the third scattering particles SC3 may scatter light to emit more light. The first scattering particles SC1, the second scattering particles SC2, and the third scattering particles SC3 may improve light extraction efficiency. At least one of the first scattering particles SC1, the second scattering particles SC2, and the third scattering particles SC3 may include any material among a metal and a metal oxide for uniformly scattering light. In an embodiment, at least one of the first scattering particles SC1, the second scattering particles SC2, and the third scattering particles SC3 may include at least one of $TiO_2$, $ZrO_2$, $Al_2O_3$, $In_2O_3$, ZnO, $SnO_2$, $Sb_2O_3$, and ITO, for example. Also, at least one of the first scattering particles SC1, the second scattering particles SC2, and the third scattering particles SC3 may have a refractive index of about 1.5 or more. Accordingly, the light extraction efficiency of the functional layer FNL may be improved. In some embodiments, at least one of the first scattering particles SC1, the second scattering particles SC2, and the third scattering particles SC3 may be omitted.

The first photosensitive polymer BR1, the second photosensitive polymer BR2, and the third photosensitive polymer BR3 may be light-transmitting organic materials. In an embodiment, at least one of the first photosensitive polymer BR1, the second photosensitive polymer BR2, and the third photosensitive polymer BR3 may include a polymer resin such as acryl, benzocyclobutene ("BCB"), or hexamethyldisiloxane ("HMDSO").

The second thin-film encapsulation layer TFE2 may be disposed on the second bank layer 600 and the functional layer FNL. The second thin-film encapsulation layer TFE2 may prevent or minimize damage or contamination of the functional layer FNL due to penetration of a foreign material such as external moisture and/or air, and may prevent cracks from occurring and spreading due to an external force. The second thin-film encapsulation layer TFE2 may protect the functional layer FNL in the display apparatus 1 having a stacked structure of elements on the substrate 100 without including an upper substrate, thereby improving reliability.

The second thin-film encapsulation layer TFE2 may cover the display area DA and may extend to the outside of the display area DA. The second thin-film encapsulation layer TFE2 may include at least one organic encapsulation layer and at least one inorganic encapsulation layer. In an embodiment, the second thin-film encapsulation layer TFE2 may include a third inorganic encapsulation layer 710, a second organic encapsulation layer 720, and a fourth inorganic encapsulation layer 730 that are sequentially stacked, for example.

Each of the third inorganic encapsulation layer 710 and the fourth inorganic encapsulation layer 730 may include at least one inorganic material from among aluminum oxide, titanium oxide, tantalum oxide, hafnium oxide, zinc oxide, silicon oxide, silicon nitride, and silicon oxynitride. The second organic encapsulation layer 720 may include a polymer-based material. In an embodiment, the polymer-based material may include an acrylic resin, an epoxy resin, polyimide, or polyethylene. In an embodiment, the second organic encapsulation layer 720 may include acrylate. The second organic encapsulation layer 720 may be formed by curing a monomer or applying a polymer.

The upper color filter CFL may be disposed on the second thin-film encapsulation layer TFE2. In an embodiment, the upper color filter CFL may be formed or disposed directly on a top surface (z-axis direction) of the second thin-film encapsulation layer TFE2, and may include the first color filter 810, the second color filter 820, and the third color filter 830. The first color filter 810 may be disposed on the first quantum dot layer 510 to correspond to the first sub-pixel PX1, the second color filter 820 may be disposed on the second quantum dot layer 520 to correspond to the second sub-pixel PX2, and the third color filter 830 may be disposed on the transmissive layer 530 to correspond to the third sub-pixel PX3. Each of the first through third color filters 810, 820, and 830 may include a photosensitive resin. Also, each of the first through third color filters 810, 820, and 830 may include a pigment or dye for reproducing a unique color.

The first color filter 810 may be a red color filter. In an embodiment, the first color filter 810 may pass only light having a wavelength ranging from about 630 nm to about 780 nm, for example. The first color filter 810 may include a red pigment or dye. The second color filter 820 may be a green color filter. In an embodiment, the second color filter 820 may pass only light having a wavelength ranging from about 495 nm to about 570 nm, for example. The second color filter 820 may include a green pigment or dye. The third color filter 830 may be a blue color filter. In an embodiment, the third color filter 830 may pass only light having a wavelength ranging from about 450 nm to about 495 nm. The third color filter 830 may include a blue pigment or dye, for example.

The upper color filter CFL may reduce the reflection of external light of the display apparatus 1. In an embodiment, when external light reaches the first color filter 810, only light having a preset wavelength may pass through the first color filter 810 and light having other wavelengths may be absorbed by the first color filter 810 as described above, for example. Accordingly, from among external light incident on the display apparatus 1, only light having a preset wavelength may pass through the first color filter 810, and part of the light may be reflected by the counter electrode 230 and/or the first sub-pixel electrode 210R and may be discharged to the outside. Because the first color filter 810 reflects only part of external light incident on a place where the first sub-pixel PX1 is disposed to the outside, the reflection of external light may be reduced. This description may also be applied to the second color filter 820 and the third color filter 830.

At least two selected from among the first color filter 810, the second color filter 820, and the third color filter 830 may overlap each other in the non-emission area. In this regard, in FIG. 5, portions of the first color filter 810, the second color filter 820, and the third color filter 830 overlap each other in the non-emission area. At least portions of the first color filter 810, the second color filter 820, and the third color filter 830 may overlap each other to define a light-blocking portion BP. Accordingly, the upper color filter CFL may prevent or reduce color mixing even without a separate light-blocking member such as a black matrix.

In other words, an overlapping portion between the first color filter 810 and the second color filter 820, an overlapping portion between the second color filter 820 and the third color filter 830, and an overlapping portion between the first color filter 810 and the third color filter 830 may function as black matrices. In an embodiment, this is because, theoretically, when the first color filter 810 passes only light having a wavelength ranging from about 630 nm to about 780 nm and the third color filter 830 passes only light having a wavelength ranging from about 450 nm to about 495 nm, light that may pass through both the first color filter 810 and the third color filter 830 does not exist in an overlapping portion between the first color filter 810 and the third color filter 830, for example.

The light-blocking portion BP may overlap a partition wall disposed between openings of the second bank layer 600, e.g., a partition wall disposed between the first opening COP1 and the second opening COP2, a partition wall disposed between the second opening COP2 and the third opening COP3, or a partition wall disposed between the first opening COP1 and the third opening COP3.

The overcoat layer 900 may cover the upper color filter CFL. The overcoat layer 900 may be an organic layer including an organic material. In an embodiment, the overcoat layer 900 may include a colorless light-transmitting organic material such as an acrylic resin, for example. The overcoat layer 900 may protect the upper color filter CFL, and may planarize a top surface of the upper color filter CFL. A bottom surface of the overcoat layer 900 may have an uneven structure due to a stacked structure of the first through third color filters 810, 820, and 830 of the upper color filter CFL. A top surface of the overcoat layer 900 may be a flat surface. In some embodiments, other layers such as a capping layer may be further disposed on the overcoat layer 900 and/or between the overcoat layer 900 and the upper color filter CFL. The capping layer may include an inorganic material. In some embodiments, the overcoat layer 900 may be covered by a window (not shown).

In a comparative example of the disclosure, when a display apparatus does not include a lower color filter that is a blue color filter, a functional layer including a quantum dot layer may be disposed directly on or adjacent to a top surface of a first thin-film encapsulation layer covering a plurality of light-emitting diodes, and thus, the probability that light incident on the display apparatus and reflected by a counter electrode and/or a sub-pixel electrode of the light-emitting diode reaches the quantum dot layer may increase and the probability that the reflection of light of the quantum dot layer may increase. Accordingly, an undesired color may be reproduced, and the color purity and luminance of the display apparatus may be deteriorated.

However, because the display apparatus 1 in an embodiment includes both the upper color filter CFL and the lower color filter 400, the display apparatus 1 may absorb, by the upper color filter CFL, part of light incident from the outside and moving toward the first through third sub-pixel electrodes 210R, 210B, and 210B of the first through third light-emitting diodes LED1, LED2, and LED3 and/or the counter electrode 230, and may block, by the lower color filter 400, part of light reflected by the first through third sub-pixel electrodes 210R, 210G, and 210B of the first through third light-emitting diodes LED1, LED2, and LED3 and/or the counter electrode 230 and moving toward the first and second quantum dot layers 510 and 520. A ratio of light reflected by the first through third sub-pixel electrodes 210R, 210G, and 210B and/or the counter electrode 230 and emitted to the outside may also be reduced. Accordingly, the reflection of light of the quantum dot layer due to external light or internal reflected light may be reduced to prevent undesired color reproduction, thereby further improving the color purity and luminance of the display apparatus 1.

Figure 6:
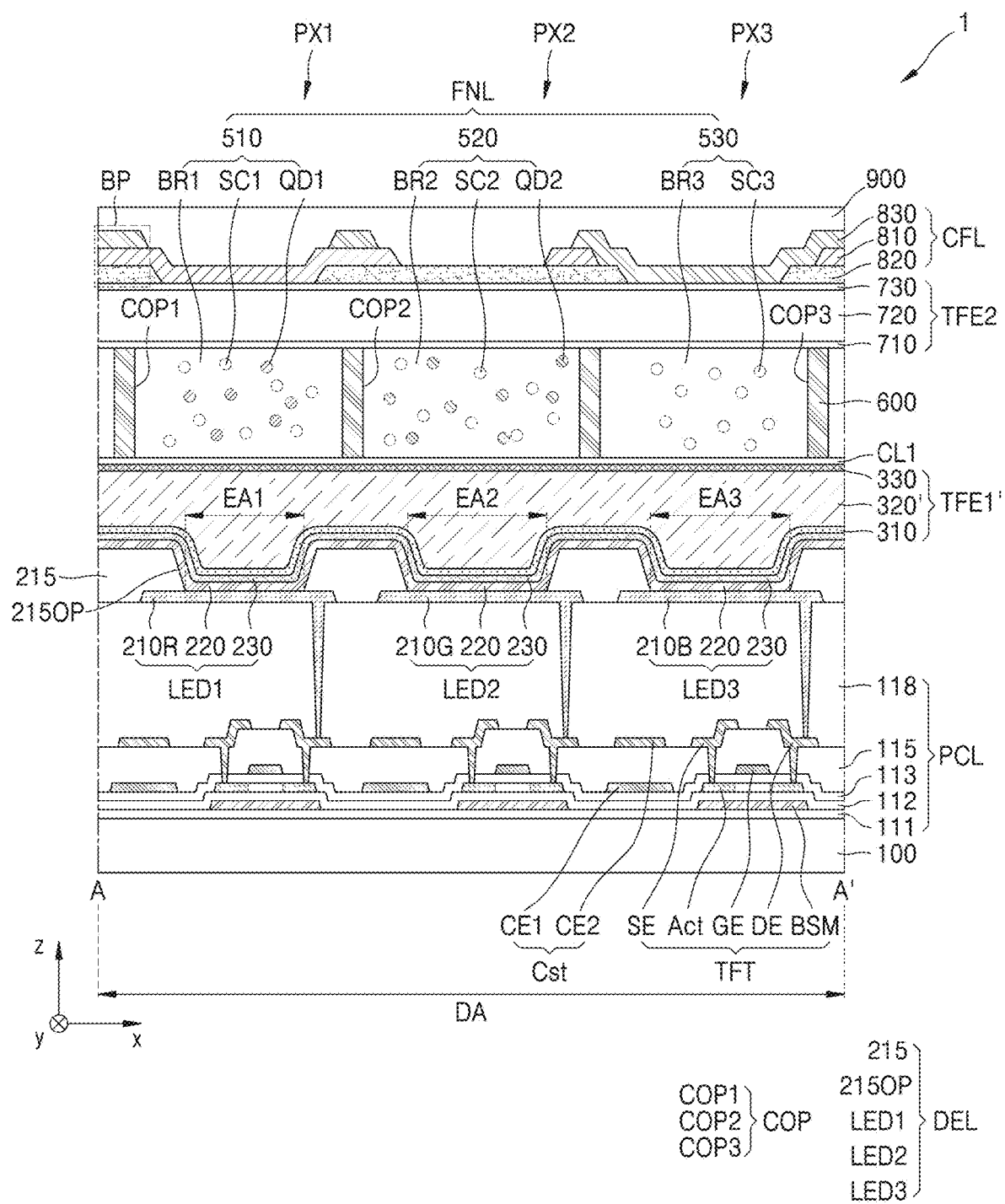
FIG. 6 is a cross-sectional view schematically illustrating another embodiment of a display apparatus.

FIG. 6 is a cross-sectional view schematically illustrating an embodiment of a display apparatus.

Referring to FIG. 6, the display apparatus 1 may not include the lower color filter 400 (refer to FIG. 5) described with reference to FIG. 5, but instead, a first organic encapsulation layer 320' of the first thin-film encapsulation layer TFE1' may include a blue pigment or a blue dye.

Because the first organic encapsulation layer 320' includes a blue pigment or a blue dye in the display apparatus 1, the first organic encapsulation layer 320' may perform a function corresponding to the lower color filter 400 described with reference to FIG. 5. The first organic encapsulation layer 320' may pass only light having a preset wavelength and may absorb light having other wavelengths. In an embodiment, the first organic encapsulation layer 320' may pass only blue light, e.g., only light having a wavelength ranging from about 450 nm to about 495 nm.

Accordingly, the first organic encapsulation layer 320' may absorb part of light passing through the upper color filter CFL from among external light incident on the display apparatus 1 or part of light reflected by the counter electrode 230 and/or the first through third sub-pixel electrodes 210R, 210G, and 210B disposed under the first organic encapsulation layer 320'. The first organic encapsulation layer 320' may minimize part of the reflected light from reaching the functional layer FNL, e.g., the first and second quantum dot layers 510 and 520. Accordingly, the reflection of light of the first and second quantum dot layers 510 and 520 due to external light or internal reflected light may be reduced, and undesired color reproduction may be prevented. The color purity and luminance of the display apparatus 1 may be improved.

Also, when the first organic encapsulation layer 320' includes a blue pigment or a blue dye, an effect corresponding to a color filter may be achieved without adding a separate process, and thus there is an economical advantage in a process.

Figure 7:
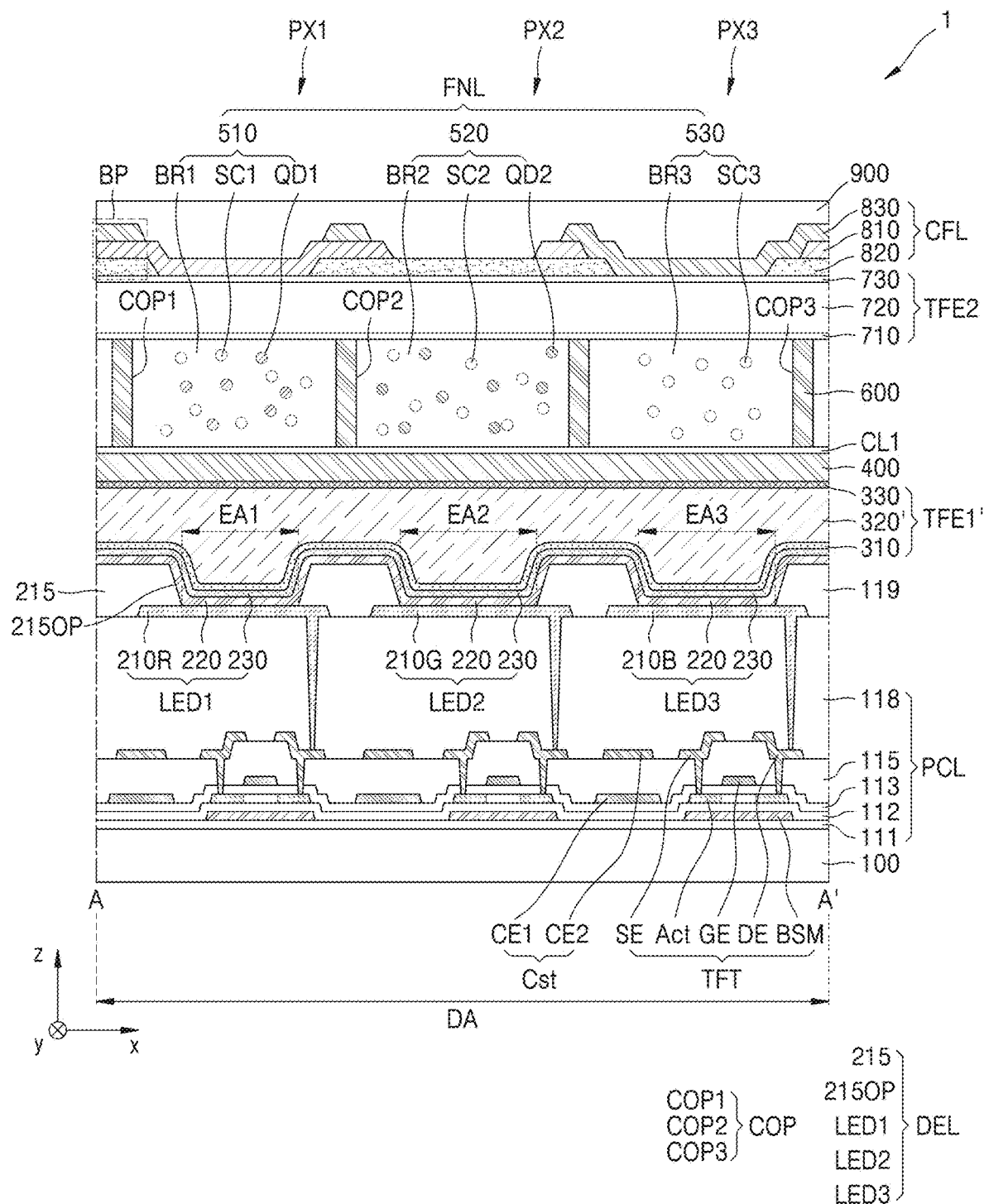
FIG. 7 is a cross-sectional view schematically illustrating another embodiment of a display apparatus.

FIG. 7 is a cross-sectional view schematically illustrating an embodiment of a display apparatus.

Referring to FIG. 7, the display apparatus 1 may include the lower color filter 400 described with reference to FIG. 5, and the first organic encapsulation layer 320' of the first thin-film encapsulation layer TFE1' may include a blue pigment or a blue dye as described with reference to FIG. 6. In this case, as described above, because external light and/or internal reflected light may be reduced by the upper color filter CFL, the lower color filter 400, and the first organic encapsulation layer 320', the reflection of light of the first and second quantum dot layers 510 and 520 may be further reduced and the color purity of the display apparatus 1 may be further improved.

Because a display apparatus in an embodiment includes a functional layer disposed between a first thin-film encapsulation layer and a second thin-film encapsulation layer and includes a blue color filter disposed between the first thin-film encapsulation layer and the functional layer, a decrease in color purity due to reflected light may be reduced. However, the scope of the invention is not limited by these effects.

It should be understood that embodiments described herein should be considered in a descriptive sense only and not for purposes of limitation. Descriptions of features or advantages within each embodiment should typically be considered as available for other similar features or advantages in other embodiments. While embodiments have been described with reference to the drawing figures, it will be understood by one of ordinary skill in the art that various changes in form and details may be made therein without departing from the spirit and scope as defined by the following claims.

What is claimed is:

1. A display apparatus comprising:
   a substrate;
   a first sub-pixel, a second sub-pixel, and a third sub-pixel which are disposed on the substrate and respectively emit different colors;
   a plurality of light-emitting devices disposed on the substrate and respectively overlapping the first sub-pixel through the third sub-pixel;
   a first thin-film encapsulation layer disposed on the plurality of light-emitting devices;
   a second thin-film encapsulation layer disposed on the first thin-film encapsulation layer and preventing of a foreign material including moisture and air, the second thin-film encapsulation layer comprising at least one inorganic encapsulation layer and at least one organic encapsulation layer;
   a functional layer disposed between the first thin-film encapsulation layer and the second thin-film encapsulation layer, and comprising:
      a first quantum dot layer corresponding to the first sub-pixel;
      a second quantum dot layer corresponding to the second sub-pixel; and
      a transmissive layer corresponding to the third sub-pixel;
   a low color filter which is a blue color filter disposed between the first thin-film encapsulation layer and the functional layer to cover all of the first sub-pixel, the second sub-pixel, and the third sub-pixel; and
   an upper color filter disposed on the second thin-film encapsulation layer.

2. The display apparatus of claim 1, wherein the upper color filter comprises:
   a first color filter corresponding to the first sub-pixel;
   a second color filter corresponding to the second sub-pixel; and
   a third color filter corresponding to the third sub-pixel.

3. The display apparatus of claim 2, wherein at least two selected from among the first color filter, the second color filter, and the third color filter overlap each other to define a light-blocking portion.

4. The display apparatus of claim 2, wherein the first color filter is a red color filter,
   the second color filter is a green color filter, and
   the third color filter is a blue color filter.

5. The display apparatus of claim 1, wherein each of the first thin-film encapsulation layer and the second thin-film encapsulation layer comprises:
   a first inorganic encapsulation layer;
   a second inorganic encapsulation layer on the first inorganic encapsulation layer; and
   an organic encapsulation layer disposed between the first inorganic encapsulation layer and the second inorganic encapsulation layer.

6. The display apparatus of claim 5, wherein
the organic encapsulation layer included in the first thin-film encapsulation layer comprises a blue pigment or dye.

7. The display apparatus of claim 1, wherein each of the plurality of light-emitting devices comprises:
a sub-pixel electrode;
a counter electrode on the sub-pixel electrode; and
an emission layer disposed between the sub-pixel electrode and the counter electrode.

8. The display apparatus of claim 7, wherein all of the plurality of light-emitting devices emit blue light.

9. The display apparatus of claim 1, wherein the first quantum dot layer converts light of a first wavelength band into light of a second wavelength band, and the second quantum dot layer converts light having a wavelength in the first wavelength band into light having a wavelength in a third wavelength band.

10. The display apparatus of claim 1, further comprising an organic layer covering the upper color filter,
wherein a bottom surface of the organic layer has an uneven structure, and
a top surface of the organic layer is a flat surface.

11. A display apparatus comprising:
a substrate;
a first sub-pixel, a second sub-pixel, and a third sub-pixel which are disposed on the substrate and respectively emit different colors;
a plurality of light-emitting devices disposed on the substrate and respectively overlapping the first sub-pixel through the third sub-pixel;
a first thin-film encapsulation layer disposed on the plurality of light-emitting devices, the first thin-film encapsulation layer comprising:
a first inorganic encapsulation layer;
a second inorganic encapsulation layer on the first inorganic encapsulation layer; and
an organic encapsulation layer disposed between the first inorganic encapsulation layer and the second inorganic encapsulation layer; the organic encapsulation layer of the first thin-film encapsulation layer comprising a blue pigment or dye;
a second thin-film encapsulation layer disposed on the first thin-film encapsulation layer, the second thin-film encapsulation layer comprising at least one inorganic encapsulation layer and at least one organic encapsulation layer and preventing of a foreign material including moisture and air;
a bank layer disposed between the first thin-film encapsulation layer and the second thin-film encapsulation layer, and allowing a first opening corresponding to the first sub-pixel, a second opening corresponding to the second sub-pixel, and a third opening corresponding to the third sub-pixel to be defined by a partition wall;
a functional layer comprising:
a first quantum dot layer filling the first opening;
a second quantum dot layer filling the second opening; and
a transmissive layer filling the third opening; and
an upper color filter disposed on the bank layer.

12. The display apparatus of claim 11, wherein the upper color filter comprises:
a first color filter corresponding to the first sub-pixel;
a second color filter corresponding to the second sub-pixel; and
a third color filter corresponding to the third sub-pixel.

13. The display apparatus of claim 12, wherein at least two selected from among the first color filter, the second color filter, and the third color filter overlap each other to define a light-blocking portion,
wherein the light-blocking portion overlaps the partition wall of the bank layer.

14. The display apparatus of claim 12, wherein the first color filter is a red color filter,
the second color filter is a green color filter, and
the third color filter is a blue color filter.

15. The display apparatus of claim 11, wherein the second thin-film encapsulation layer comprises at least one inorganic encapsulation layer and at least one organic encapsulation layer.

16. The display apparatus of claim 11, wherein each of the plurality of light-emitting devices comprises:
a sub-pixel electrode;
a counter electrode on the sub-pixel electrode; and
an emission layer disposed between the sub-pixel electrode and the counter electrode.

17. The display apparatus of claim 16, wherein all of the plurality of light-emitting devices emit blue light.

18. The display apparatus of claim 11, wherein the first quantum dot layer converts light of a first wavelength band into light of a second wavelength band, and the second quantum dot layer converts light having a wavelength in the first wavelength band into light having a wavelength in a third wavelength band.

19. The display apparatus of claim 11, further comprising an organic layer covering the upper color filter,
wherein a bottom surface of the organic layer has an uneven structure, and
a top surface of the organic layer is a flat surface.

20. The display apparatus of claim 11, further comprising a lower color filter which is a blue color filter disposed between the first thin-film encapsulation layer and the bank layer to cover all of the first sub-pixel, the second sub-pixel, and the third sub-pixel.

* * * * *